United States Patent
Sim et al.

(10) Patent No.: US 10,304,612 B2
(45) Date of Patent: May 28, 2019

(54) COMMON MODE FILTER

(71) Applicant: SAMSUNG ELECTRO-MECHANICS CO., LTD., Suwon-si, Gyeonggi-do (KR)

(72) Inventors: Won Chul Sim, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 171 days.

(21) Appl. No.: 15/409,783

(22) Filed: Jan. 19, 2017

(65) Prior Publication Data

US 2017/0294261 A1    Oct. 12, 2017

(30) Foreign Application Priority Data

Apr. 6, 2016  (KR) .................. 10-2016-0042520

(51) Int. Cl.
| | |
|---|---|
| H01F 27/29 | (2006.01) |
| H01F 27/28 | (2006.01) |
| H03H 7/01 | (2006.01) |
| H01F 17/00 | (2006.01) |
| H03H 7/42 | (2006.01) |
| H03H 1/00 | (2006.01) |

(52) U.S. Cl.
CPC ..... H01F 27/2804 (2013.01); H01F 17/0013 (2013.01); H01F 27/292 (2013.01); H03H 7/01 (2013.01); H03H 7/427 (2013.01); *H01F 2017/0093* (2013.01); *H01F 2027/2809* (2013.01); *H03H 1/00* (2013.01); *H03H 2001/005* (2013.01); *H03H 2001/0085* (2013.01)

(58) Field of Classification Search
CPC ............................................ H01F 27/00–27/36
USPC ............................ 336/65, 83, 200, 232–234
See application file for complete search history.

(56) References Cited

U.S. PATENT DOCUMENTS

| | | |
|---|---|---|
| 2011/0285477 A1 | 11/2011 | Nakagawa et al. |
| 2014/0347773 A1 | 11/2014 | Park et al. |
| 2015/0214915 A1 | 7/2015 | Yosui et al. |

FOREIGN PATENT DOCUMENTS

| | | |
|---|---|---|
| JP | 2004-079973 A | 3/2004 |
| JP | 2007-150209 A | 6/2007 |
| JP | 2007-259026 A | 10/2007 |
| JP | 2009-239770 A | 10/2009 |
| JP | 2012-019443 A | 1/2012 |
| JP | 5029726 B2 | 9/2012 |
| JP | 2014-175825 A | 9/2014 |

(Continued)

OTHER PUBLICATIONS

Office Action issued in corresponding Japanese Patent Application No. 2017-006891, dated Dec. 26, 2017, with English Translation.

(Continued)

*Primary Examiner* — Tuyen T Nguyen
(74) *Attorney, Agent, or Firm* — Morgan Lewis & Bockius LLP

(57) ABSTRACT

A common mode filter includes a body portion including an external electrode disposed outwardly of the body portion, a plurality of coil electrode layers disposed within the body portion and electrically connected to the external electrode, and a shunt electrode layer disposed between portions of the plurality of coil electrode layers and having a coil shape.

20 Claims, 3 Drawing Sheets

(56) References Cited

FOREIGN PATENT DOCUMENTS

| JP | 2014-233074 A | 12/2014 |
| JP | 2016-018812 A | 2/2016 |
| KR | 10-1445741 B1 | 10/2014 |
| WO | 2017/086283 A1 | 5/2017 |

OTHER PUBLICATIONS

Office Action dated Jun. 20, 2017, issued in corresponding Korean Patent Application No. 10-2016-0042520, with English language translation.

COMMON MODE FILTER

CROSS-REFERENCE TO RELATED APPLICATION(S)

This application claims benefit of priority to Korean Patent Application No. 10-2016-0042520 filed on Apr. 6, 2016 in the Korean Intellectual Property Office, the disclosure of which is incorporated herein by reference in its entirety.

BACKGROUND

1. Field

The present disclosure relates to a common mode filter.

2. Description of Related Art

As technology advances, electronic devices such as mobile phones, home appliances, personal computers (PC), personal digital assistants (PDA), and liquid crystal displays (LCD) have changed to use a digital operating scheme, rather than an analog operating scheme. As a result, processing speeds thereof have increased in concert with an increase in data throughput. Thus, USB 2.0, USB 3.0, and high definition multimedia interfaces (HDMI) have come into widespread use as high-speed signal transmission interfaces, and such interfaces have been used in a range of digital devices, such as personal computers and digital high-definition television sets.

Such high-speed interfaces commonly employ a differential signal system in which differential signals are transmitted, for example using differential mode signals, across a pair of signal lines. These interface contrast with single-end transmission systems which have been commonly used for a long period of time. Since digitized and high-speed electronic devices are sensitive to external stimulation, the devices can suffer from signal distortion due to high-frequency noise.

Switching voltages generated in circuits, power noise included in power supply voltages, unnecessary electromagnetic signals or electromagnetic noise, and the like may cause the occurrence of such abnormal voltages and noise. As a means of preventing such abnormal voltages and high-frequency noise from being introduced into circuits, common mode filters (CMF) can be used.

In order to remove common mode noise affecting communications sensitivity in mobile devices, common mode filters are often expected to have broadband attenuation characteristics in a communications frequency band of 0.7 GHz to 2.6 GHz.

A common mode filter having a shunt electrode structure has previously been proposed to secure such broadband attenuation characteristics. However, such a common mode filter does not generally provide sufficient attenuation characteristics in a low-frequency domain.

SUMMARY

An aspect of the present disclosure is to provide a common mode filter having excellent attenuation characteristics in a lower frequency domain while having broadband attenuation characteristics.

According to an aspect of the present disclosure, a common mode filter includes a body portion including an external electrode disposed outwardly of the body portion, a plurality of coil electrode layers disposed within the body portion and electrically connected to the external electrode, and a shunt electrode layer disposed between portions of the plurality of coil electrode layers and having a coil shape.

According to an aspect of the present disclosure, a common mode filter includes a substrate, a filter portion disposed on a surface of the substrate and including a plurality of coil electrode layers, and a shunt electrode disposed between portions of the plurality of coil electrode layers and having a coil shape.

According to another aspect of the present disclosure, a common mode filter includes a body portion and first, second, and third electrode layers sequentially stacked in the body portion and each having a coil shape. The second electrode layer is disposed between the first and third electrode layers in a stacking direction, and the second electrode layer is electrically connected to only one external electrode of the common mode filter.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
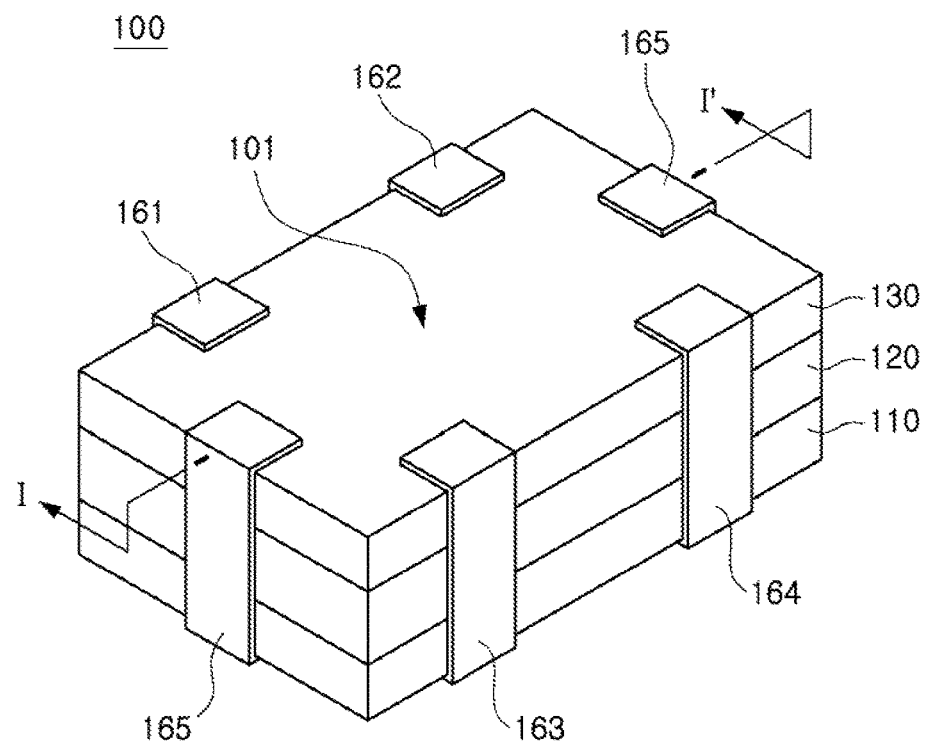
FIG. 1 is a schematic perspective view of a common mode filter according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region, or wafer (substrate), is referred to as being "on, " "connected to, " or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of the embodiments.

Spatially relative terms, such as "above," "upper," "below," and "lower" and the like, may be used herein for ease of description to describe one element's positional relationship relative to other element(s) in the orientations shown in the figures. It will be understood that the spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements or features. Thus, the term "above" can encompass both the above and below orientations depending on the particular direction of the figures or device. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, members, elements, and/or groups, but do not preclude the presence or addition of one or more other features, integers, steps, operations, members, elements, and/or groups.

Hereinafter, embodiments of the present disclosure will be described with reference to schematic views illustrating embodiments of the present disclosure. In the drawings, components having ideal shapes are shown. However, variations from these ideal shapes, for example due to variability in manufacturing techniques and/or tolerances, also fall within the scope of the disclosure. Thus, embodiments of the present disclosure should not be construed as being limited to the particular shapes of regions shown herein, but should more generally be understood to include changes in shape resulting from manufacturing methods and processes. The following embodiments may also be constituted by one or a combination thereof.

The present disclosure describes a variety of configurations, and only illustrative configurations are shown. However, the disclosure is not limited to the particular illustrative configurations presented herein, but extends to other similar/analogous configurations as well.

Figure 2:
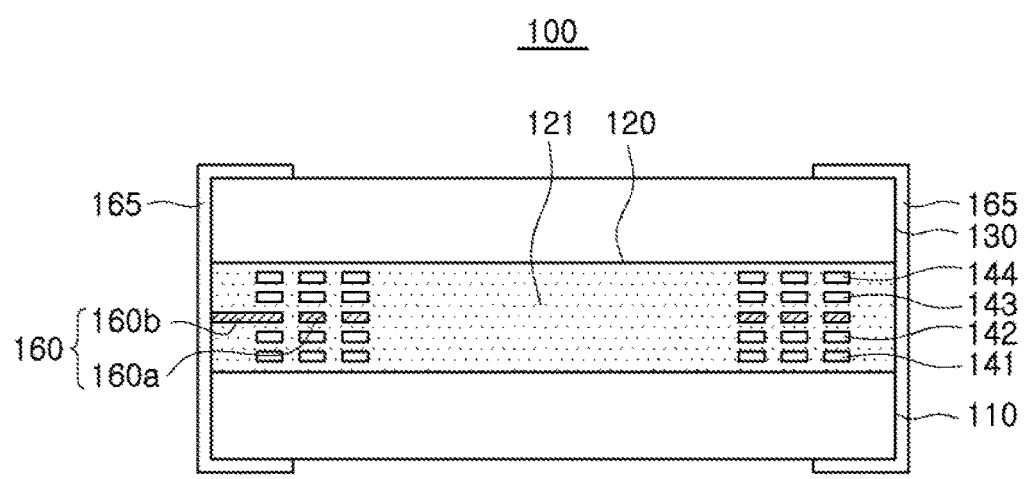
FIG. 2 is a schematic cross-sectional view taken along line I-I' of FIG. 1.

FIG. 1 is a schematic perspective view of a common mode filter 100 according to an exemplary embodiment, and FIG. 2 is a schematic cross-sectional view taken along line I-I' of FIG. 1.

A configuration of the common mode filter 100 according to an exemplary embodiment will be described with reference to FIGS. 1 and 2. The common mode filter 100 may include a body portion 101 including one or more coil electrode layers 141, 142, 143 and 144 having a helical form therein and external electrodes 161, 162, 163 and 164 disposed on outer surfaces of the body portion 101.

In addition, the common mode filter 100 may include ground electrodes 165 disposed on outer surfaces of the body portion 101.

The external electrodes 161, 162, 163 and 164 may be disposed on side surfaces of the body portion 101 opposing each other in a width direction, and the ground electrodes 165 may be disposed on end surfaces of the body portion 101 opposing each other in a length direction.

The body portion 101 may include a substrate 110, a filter portion 120 and a cover portion 130.

The substrate 110 and the cover portion 130 may be formed of a magnetic ceramic material.

The filter portion 120 may include at least one coil electrode layer within a dielectric 121, and may include first to fourth coil electrode layers 141, 142, 143 and 144 disposed from a lower portion in a thickness direction as illustrated in FIG. 2, but is not limited thereto.

The filter portion 120 may include a plurality of the coil electrode layers 141, 142, 143 and 144 to serve to remove noise signals.

The first to fourth coil electrode layers 141, 142, 143 and 144 may be formed by winding a conductive wire formed of a conductive material around an insulating layer at least one or more times to thus have a helical form, or may be formed using a conductive paste, a photoresist method, and the like.

One end of at least a portion of the first to fourth coil electrode layers 141, 142, 143 and 144 may be exposed to a side of the body portion 101.

The first and third coil electrode layers 141 and 143 may be electrically connected to each other by a conductive via (not shown) penetrating through the dielectric 121. The conductive via may be formed by forming a via hole using a laser punching or mechanical punching method and filling the via hole with a conductive material.

The first and third coil electrode layers 141 and 143 may be electrically connected to first and third external electrodes 161 and 163, respectively.

In addition, the second and fourth coil electrode layers 142 and 144 may be electrically connected to each other by a conductive via (not shown) penetrating through the dielectric 121. The second and fourth coil electrode layers 142 and 144 may be electrically connected to second and fourth external electrodes 162 and 164, respectively.

A shunt electrode layer 160 may be disposed between at least portions of the plurality of coil electrode layers 141, 142, 143 and 144.

As illustrated in FIG. 2, the shunt electrode layer 160 may be located between the second and third coil electrode layers 142 and 143, corresponding to a central position within the stacked plurality of coil electrode layers 141, 142, 143 and 144. In this way, the shunt electrode layer 160 may effectively be located between the first and third coil electrode layers 141 and 143, and between the second and fourth coil electrode layers 143 and 144.

Alternatively, the shunt electrode layer 160 may be disposed between the first and second coil electrode layers 141 and 142 or between the third and fourth coil electrode layers 143 and 144. Furthermore, in other examples, the shunt electrode layer 160 may include multiple layers so as to be disposed between the second and third coil electrode layers 142 and 143 as well as between the first and second coil electrode layers 141 and 142 or between the third and fourth coil electrode layers 143 and 144.

Figure 3:
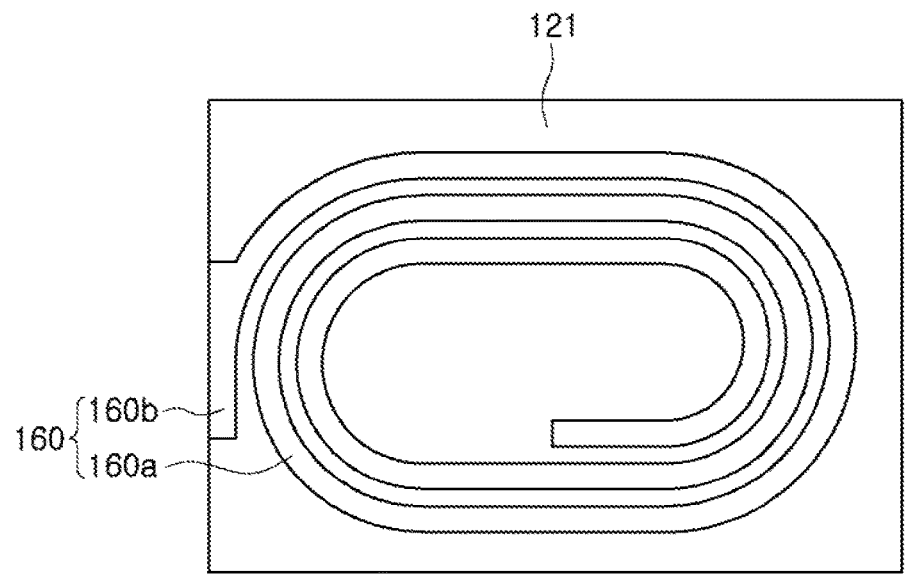
FIG. 3 is a schematic plan view of a shunt electrode layer.

With reference to FIG. 3, the shunt electrode layer 160 included in the common mode filter 100 according to an exemplary embodiment may have a coil shape.

The shunt electrode layer 160 may include a shunt portion 160a and a lead-out portion 160b.

The lead-out portion 160b may be connected to the ground electrode 165 disposed on an outer surface of the body portion 101, to allow the shunt electrode layer 160 to be grounded.

The shunt electrode layer 160 and the coil electrode layers adjacent thereto (e.g., 142 and 143) may have regions corresponding to each other in a vertical direction. For example, the shunt electrode layer 160 and the coil electrode layers adjacent thereto may be stacked, and windings of the shunt portion 160a of the shunt electrode layer 160 may be disposed so as to be overlapped in the stacking direction with windings of the coil electrode layers adjacent thereto.

Although the case in which the shunt electrode layer 160 is disposed between the second and third coil electrode layers 142 and 143 is illustrated in FIG. 2 by way of example, the shunt electrode layer 160 may also be disposed between other sets of adjacent coil electrode layers (e.g., between the first and second coil electrode layers 141 and 142 or between the third and fourth coil electrode layers 143 and 144). In such cases, the shunt electrode layer 160 and the coil electrode layers adjacent thereto may also have regions corresponding to each other in a vertical direction.

Hereinafter, an effect of the common mode filter 100 according to an exemplary embodiment will be described with reference to FIGS. 4 and 5.

Figure 4:
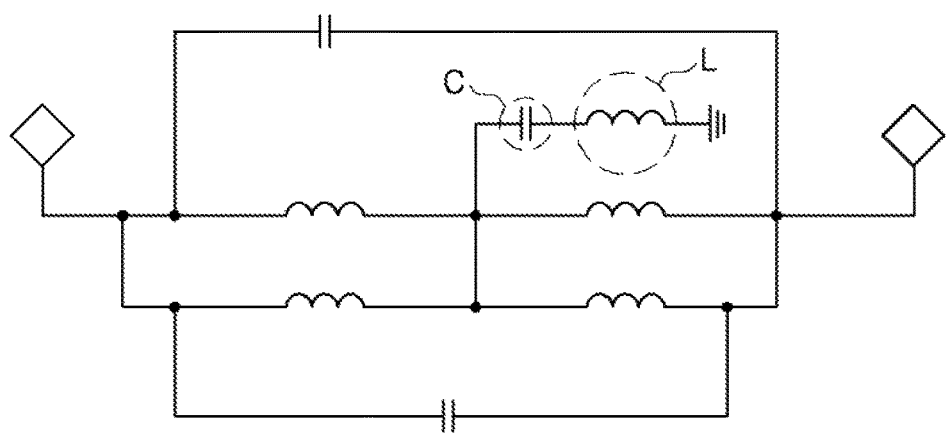
FIG. 4 is a circuit schematic showing an equivalent circuit of a common mode filter according to an exemplary embodiment.
Figure 5:
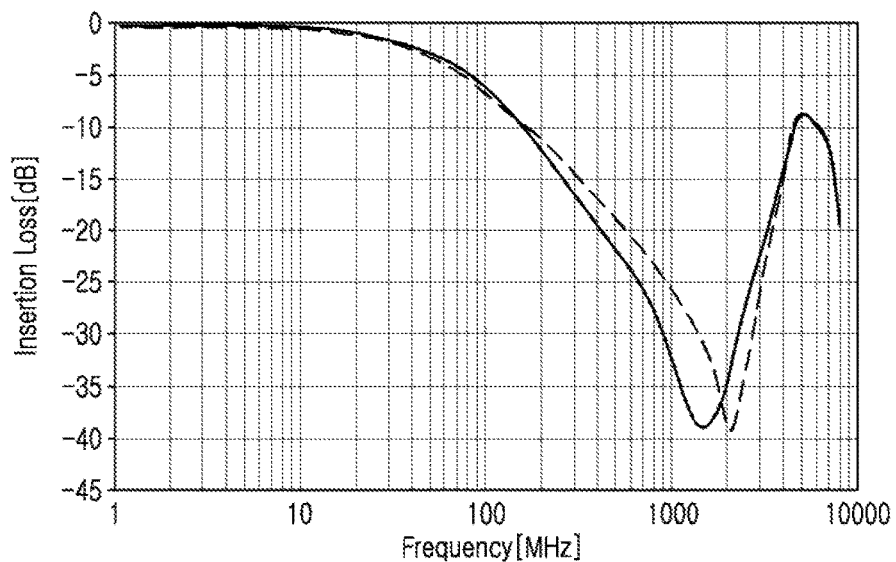
FIG. 5 is a graph illustrating transmission characteristics and attenuation characteristics of common mode filters according to a Comparative Example (represented by a broken line) including a planar shunt electrode layer and an Exemplary Embodiment (represented by a solid line) including a coil-shaped shunt electrode layer.

FIG. 4 is a circuit schematic of an equivalent circuit of a common mode filter according to an exemplary embodiment, while FIG. 5 is a graph illustrating transmission and attenuation characteristics of a common mode filter (represented by a broken line) including a planar shunt electrode layer (such as that described in the following Comparative Example) and transmission and attenuation characteristics of a common mode filter (represented by a solid line) without a planar shunt electrode layer (such as that described in the following Exemplary Embodiment).

Referring to a terminal that is illustrated as being grounded in the equivalent circuit diagram of FIG. 4, it can be seen that inductance L is generated in addition to parasitic capacitance C by the shunt electrode layer 160.

TABLE 1

|  | Comparative Example | Exemplary Embodiment |
|---|---|---|
| L (nH) | 0 | 18 |
| C (pF) | 1.0 | 0.45 |

The Comparative Example illustrates the case in which the planar shunt electrode layer is included, and the Exemplary Embodiment illustrates the case in which the coil-shaped shunt electrode layer is included (e.g., as in common mode filter 100 described above).

As can be seen from Table 1, in the case of the common mode filter 100 according to an exemplary embodiment in the present disclosure, since the shunt electrode layer 160 has a coil shape, inductance may be provided. In contrast, no inductance may be provided in the Comparative Example.

In the case of attenuation characteristics measured in the Comparative Example (represented by a broken line) in which the planar shunt electrode layer is used, the graph of FIG. 5 illustrates that one pole is added to thus represent a total of two poles. In this case, attenuation characteristics may be improved in a wide frequency domain of 1 to 3 GHz. For example, in the case in which the planar shunt electrode layer is used, there may be an effect in which a frequency domain in which required attenuation characteristics may be obtained is relatively wide.

In this way, in the case in which the planar shunt electrode layer is used (e.g., in the Comparative Example), a pole may be moved to a high frequency band, and thus, a problem in which attenuation characteristics in a low frequency domain corresponding to 0.7 GHz to 1.0 GHz are decreased may occur.

In contrast, in the case of the Exemplary Embodiment (represented by a solid line), it can be appreciated that a pole is moved to a low frequency domain due to the shunt electrode layer 160 having a coil shape, as compared with the Comparative Example (represented by the broken line), as illustrated in FIG. 5.

In detail, it can be seen that on the basis of −25 dB of attenuation, the Comparative Example has −25 dB of attenuation or less in a region of 1 GHz to 3 GHz. Thus, the Comparative Example may not obtain satisfactory attenuation characteristics in a low frequency domain of 0.7 GHz to 1.0 GHz (i.e., within a communications frequency band of 0.7 GHz to 2.6 GHz).

However, in the case of the common mode filter 100 according to the Exemplary Embodiment, since the coil-shaped shunt electrode layer 160 has inductance, a pole may be moved to a low frequency domain as illustrated in FIG. 5. As such, the common mode filter 100 according to the Exemplary Embodiment can satisfy the −25 dB of attenuation or less in a region (or band) from 0.7 GHz to 2.8 GHz, thereby improving low frequency attenuation characteristics.

Figure 6:
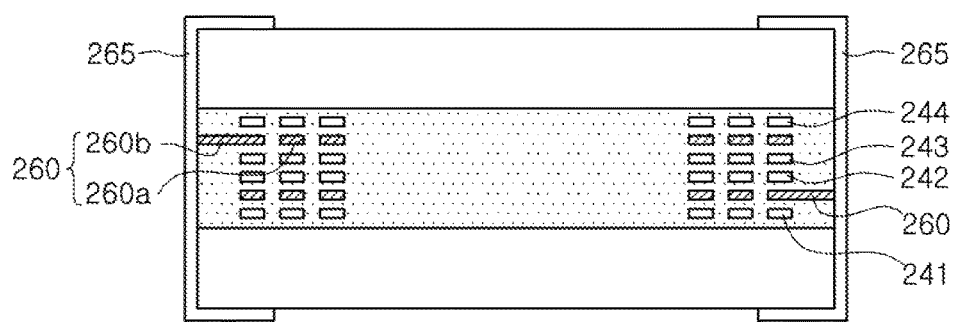
FIG. 6 is a schematic cross-sectional view of a common mode filter according to another exemplary embodiment.

FIG. 6 is a schematic cross-sectional view of a common mode filter 200 according to another exemplary embodiment. A description of the same components as those of the foregoing embodiment will be omitted.

The common mode filter 200 according to the other exemplary embodiment may include at least two shunt electrode layers 260.

For example, when at least two shunt electrode layers 260 are provided, one shunt electrode layer 260 may be connected to one ground electrode 265 (e.g., each shunt electrode layer 260 may be connected to a corresponding ground electrode 265).

For example, when the shunt electrode layers 260 are provided as at least two layers, the ground electrodes 265 may also be provided in the same number as the number of shunt electrode layers 260 (e.g., such that each shunt electrode layer 260 can be connected to a different ground electrode 265).

In other examples, in a manner different therefrom, a plurality of shunt electrode layers 260 may also be connected to one same ground electrode 265.

For example, when the shunt electrode layer 260 is provided as two shunt electrode layers, one shunt electrode layer 260 may be disposed between first and second coil electrode layers 241 and 242 and the other shunt electrode layer 260 may be disposed between third and fourth coil electrode layers 243 and 244. Alternatively, the shunt electrode layers 260 may be disposed between the first and second coil electrode layers 241 and 242 and between the second and third coil electrode layers 242 and 243, or may be disposed between the second and third coil electrode layers 242 and 243 and between the third and fourth coil electrode layers 243 and 244.

In a further example, if the shunt electrode layer 260 is provided as three shunt electrode layers, each shunt electrode layer 260 may be disposed in a respective one of the three gaps between adjacent ones of the first to fourth coil electrode layers 241 to 244.

As set forth above, a common mode filter according to an exemplary embodiment may include a coil-shaped shunt electrode, and thus may have excellent attenuation characteristics in a lower frequency domain while having broadband attenuation characteristics.

While example embodiments have been shown and described above, it will be apparent to those skilled in the art that modifications and variations could be made without departing from the scope of the present inventive concepts as defined by the appended claims.

What is claimed is:

1. A common mode filter comprising:
   a body portion including an external electrode disposed outwardly of the body portion;
   a plurality of coil electrode layers stacked within the body portion and electrically connected to the external electrode; and
   a shunt electrode layer stacked between portions of the plurality of coil electrode layers and having a coil shape,
   wherein at least one winding of the coil shaped shunt electrode layer corresponds and overlaps with at least one winding of a coil electrode layer disposed thereabove and with at least one winding of a coil electrode layer disposed therebelow in a stacking direction of the coil electrode layers.

2. The common mode filter of claim 1, further comprising a ground electrode disposed outwardly of the body portion, wherein the shunt electrode layer is electrically connected to the ground electrode.

3. The common mode filter of claim 1, wherein the shunt electrode layer is disposed between distinct windings of the coil electrode layers among the plurality of coil electrode layers, and
   a plurality of windings of the coil shaped shunt electrode layer correspond and overlap with a plurality of windings of the coil electrode layer disposed thereabove and with a plurality of windings of the coil electrode layer disposed therebelow in the stacking direction of the coil electrode layers.

4. The common mode filter of claim 1, wherein the shunt electrode layer is disposed such that at least three windings thereof overlap with at least three windings of the coil electrode layers adjacent thereto in a vertical direction.

5. The common mode filter of claim 1, wherein the shunt electrode layer comprises at least two shunt electrode layers.

6. The common mode filter of claim 5, wherein each shunt electrode layer is disposed between a different pair of adjacent coil electrode layers among the plurality of coil electrode layers.

7. The common mode filter of claim 5, wherein each shunt electrode layer includes a respective lead-out portion extending from the shunt electrode layer to a different respective ground electrode disposed outwardly of the body portion.

8. The common mode filter of claim 1, wherein the shunt electrode layer provides attenuated low frequency characteristics.

9. The common mode filter of claim 1, wherein the common mode filter exhibits 25 dB of attenuation or more in a region from a 0.7 GHz band to a 2.6 GHz band.

10. The common mode filter of claim 1, wherein the shunt electrode layer is disposed between distinct windings of the coil electrode layers that are connected to each other by a conductive via.

11. A common mode filter comprising:
    a substrate;
    a filter portion disposed on a surface of the substrate, and including first, second and third coil electrode layers; and
    first and second shunt electrodes each disposed between different respective pairs of the first, second and third coil electrode layers and each having a coil shape.

12. The common mode filter of claim 11, wherein the first and second shunt electrodes are grounded.

13. The common mode filter of claim 11, wherein the first, second, and third coil electrode layers are sequentially stacked, and the coil shaped first shunt electrode is disposed between the first and second coil electrode layers and the coil shaped second shunt electrode is disposed between the second and third coil electrode layers.

14. The common mode filter of claim 11, wherein the first, second and third coil electrode layers are stacked, and the coil shaped first and second shunt electrodes are disposed to overlap with coil-shaped windings of the coil electrode layers adjacent thereto in a stacking direction of the coil electrode layers.

15. The common mode filter of claim 11, further comprising a third shunt electrode having a coil shape and disposed in the filter portion.

16. The common mode filter of claim 11, wherein the shunt electrode provides attenuated low frequency characteristics.

17. The common mode filter of claim 11, wherein the common mode filter exhibits 25 dB of attenuation or more in a band from 0.7 GHz to 2.6 GHz.

18. A common mode filter comprising:
    a body portion; and
    first, second, and third electrode layers sequentially stacked in the body portion and each having a coil shape,
    wherein the second electrode layer is disposed between the first and third electrode layers in a stacking direction, the second electrode layer is electrically connected to only one external electrode of the common mode filter, and coil windings of the coil shaped second electrode layer correspond and overlap with coil windings of the coil shaped first and third electrode layer in a stacking direction of the electrode layers.

19. The common mode filter of claim 18, wherein the coil shape of the second electrode layer has first and second ends, and only one end among the first and second ends of the second electrode layer is connected to an external electrode of the common mode filter.

20. The common mode filter of claim 19, wherein the first and third electrode layers are electrically connected in series through a conductive via between two external electrodes of the common mode filter.

* * * * *